US009513647B2

(12) United States Patent
Wismar et al.

(10) Patent No.: US 9,513,647 B2
(45) Date of Patent: Dec. 6, 2016

(54) DC LINEAR VOLTAGE REGULATOR COMPRISING A SWITCHABLE CIRCUIT FOR LEAKAGE CURRENT SUPPRESSION

(71) Applicant: Analog Devices Global, Hamilton (BM)

(72) Inventors: Ulrik Sørensen Wismar, Kalundborg (DK); Khiem Quang Nguyen, Tewksbury, MA (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/673,137

(22) Filed: Mar. 30, 2015

(65) Prior Publication Data

US 2016/0291618 A1 Oct. 6, 2016

(51) Int. Cl.
*H03K 17/04* (2006.01)
*G05F 1/575* (2006.01)

(52) U.S. Cl.
CPC .................................... *G05F 1/575* (2013.01)

(58) Field of Classification Search
CPC ............ H03K 17/6872; H03K 17/0822; H03K 2017/0806
USPC ....... 327/109, 110, 365, 387, 403, 407, 408; 323/282-290; 361/56, 111
See application file for complete search history.

(56) References Cited

U.S. PATENT DOCUMENTS 5,757,213 A * 5/1998 Moller ................. H03K 17/687 327/108
5,828,247 A * 10/1998 Moller ............... H03K 17/0822 327/110
6,545,513 B2 * 4/2003 Tsuchida .................. H03K 4/94 323/274
7,057,240 B2 * 6/2006 Topp ....................... F02P 3/051 257/368
7,724,046 B2 * 5/2010 Wendt ................ H03K 17/6872 327/110

* cited by examiner

*Primary Examiner* — Rajnikant Patel
(74) *Attorney, Agent, or Firm* — Schwegman Lundberg & Woessner, P.A.

(57) ABSTRACT

The present invention relates in one aspect to a DC linear voltage regulator circuit for generating a regulated DC output voltage based on a DC input voltage. The DC linear voltage regulator circuit comprises a DMOS pass transistor comprising drain, gate, source and bulk terminals wherein the drain terminal is connected to a regulator output which is configured to supply the regulated DC output voltage and the source terminal is connected to a regulator input for receipt of the DC input voltage. The DC linear voltage regulator circuit comprises a switchable leakage prevention circuit, connected to the bulk terminal of the DMOS pass transistor, and configured to automatically detect and interrupt a flow of leakage current from the regulator output to the bulk terminal.

18 Claims, 7 Drawing Sheets

DC LINEAR VOLTAGE REGULATOR COMPRISING A SWITCHABLE CIRCUIT FOR LEAKAGE CURRENT SUPPRESSION

The present invention relates in one aspect to a DC linear voltage regulator circuit for generating a regulated DC output voltage based on a DC input voltage. The DC linear voltage regulator circuit comprises a DMOS pass transistor comprising drain, gate, source and bulk terminals wherein the drain terminal is connected to a regulator output which is configured to supply the regulated DC output voltage and the source terminal is connected to a regulator input for receipt of the DC input voltage. The DC linear voltage regulator circuit comprises a switchable leakage prevention circuit, connected to the bulk terminal of the DMOS pass transistor, and configured to automatically detect and interrupt a flow of leakage current from the regulator output to the bulk terminal.

BACKGROUND OF THE INVENTION

The present invention relates to a DC linear voltage regulator circuit for generating a regulated DC output voltage based on a DC input voltage. The DC linear voltage regulator circuit comprises a switchable leakage prevention circuit configured to automatically detect and interrupt a flow of leakage current from the regulator output to the bulk terminal of a DMOS pass transistor of the regulator. Certain types of applications of DMOS based DC linear voltage regulators require that an external DC voltage source can be applied to a regulator output under operating conditions where the DC voltage at the regulator input, i.e. the supply voltage of the DC linear regulator circuit, is zero or much smaller than the DC voltage forced onto the regulator output. Applying this type of reverse voltage operating conditions to prior art DMOS based DC linear voltage regulators will often result in a huge and unacceptable reverse leakage current flowing from the regulator output into the DMOS pass transistor. This imparts and serious waste of power in the DC linear voltage regulator circuit under reverse operation conditions and may additionally damage various active and passive components the DC linear voltage regulator by overheating. There are at least two mechanisms that cause this undesired reverse flow of leakage current. A large portion of the leakage current is flowing through the bulk of the DMOS pass transistor device because the bulk is connected to the regulator input which is connected to the DC input voltage during normal operation of the DC linear voltage regulator. In addition another portion of the leakage current may be flowing through the channel of the DMOS pass transistor because an output of the driver or error amplifier for the DMOS pass transistor and a Zener protection diode on a gate terminal of the DMOS pass transistor grounds the gate terminal when the DC input voltage is zero. Even though the DMOS is asymmetric between drain and source there may be formed a channel in the DMOS pass transistor supporting a substantial reverse current flow.

Hence, it will be advantageous to provide a of DMOS based DC linear voltage regulator circuit that can withstand the above-mentioned reverse operating conditions without suffering from a huge flow of reverse leakage current from the external DC voltage source coupled to the regulator output and into the DMOS pass transistor.

SUMMARY OF THE INVENTION

A first aspect of the invention relates to a DC linear voltage regulator circuit for generating a regulated DC output voltage based on a DC input voltage. The DC linear voltage regulator circuit comprises a DMOS pass transistor comprising drain, gate, source and bulk terminals wherein the drain terminal is connected to a regulator output which is configured to supply the regulated DC output voltage and the source terminal is connected to a regulator input for receipt of the DC input voltage. An error amplifier of the DC linear voltage regulator circuit is responsive to a voltage or current difference between a first input and a second input of the error amplifier to generate an error voltage at the gate terminal of the DMOS pass transistor and a DC reference voltage generator is configured to supply a DC reference voltage at the first input of the error amplifier. A voltage regulation loop is coupled between the regulated DC output voltage and the second input of the error amplifier. The DC linear voltage regulator circuit additionally comprises a switchable leakage prevention circuit, connected to the bulk terminal of the DMOS pass transistor, and configured to automatically detect and interrupt a flow of leakage current from the regulator output to the bulk terminal.

The switchable leakage prevention circuit is capable of suppressing or eliminating the above discussed huge flow of leakage current from the regulator output into the bulk terminal of the DMOS pass transistor under the reverse voltage operation conditions of the DC linear voltage regulator. These reverse voltage operation conditions are typically reached when the DC voltage generated by an external DC voltage source coupled to the regulator output exceeds the DC voltage at the regulator input for example by a certain amount such as one diode voltage drop. These reverse voltage operation conditions may be reached for various reasons for example due to an unpowered state or failure of a DC voltage supply delivering the DC input voltage to the regulator input. The DMOS pass transistor may comprise a PDMOS transistor or NDMOS transistor depending on the polarity of the DC input voltage and the regulated DC output voltage relative to a ground potential of the DC linear voltage regulator circuit.

The switchable leakage prevention circuit preferably comprises one or more controllable semiconductor switches each comprising at least one PMOS and/or NMOS transistor. The one or more controllable semiconductor switches may be connected to the bulk terminal of the DMOS pass transistor to electrically connect the bulk terminal to different circuit nodes of the DC linear voltage regulator circuit depending on the relative magnitudes of the DC voltages at the regulator input and the regulator output.

In one embodiment of the DC linear voltage regulator circuit, the switchable leakage protection circuit comprises:

a first switch state connecting the bulk terminal of the DMOS pass transistor to the regulator input; and a second switch state connecting the bulk terminal of the DMOS pass transistor to the regulator output and connecting the gate terminal of the DMOS pass transistor to the regulator output. This may be achieved by an appropriate configuration and control of two, three or more individual semiconductor switch arrangements. Each of these individual semiconductor switch arrangements may comprise one or more controllable semiconductor switches such as PMOS and/or NMOS transistors.

According to one such embodiment, the switchable leakage protection circuit comprises first and second semiconductor switch arrangements configured to selectively connect the bulk terminal of the DMOS pass transistor to the regulator input and the regulator output in accordance with the first and second switch states of the switchable leakage protection circuit. A third semiconductor switch arrangement is furthermore configured to connect and disconnect the regulator output and the gate terminal of the DMOS pass transistor in accordance with the first and second switch states of the switchable leakage protection circuit as discussed in further detail below with reference to the appended drawings.

The skilled person will understand that the DC input voltage at the regulator input under normal operating conditions may be either both be positive or both negative relative to a ground potential of the DC linear voltage regulator circuit. The absolute value of the regulated DC output voltage is smaller than the absolute value of DC input voltage for example at least 0.5 V or 1.0 V smaller to allow an appropriate bias voltage across the DMOS pass transistor.

The switchable leakage protection circuit may be configured to:

selecting the first switch state in response to an absolute value of the DC input voltage exceeds an absolute value of the regulated DC output voltage; and selecting the second switch state in response to an absolute value of the DC input voltage is smaller than an absolute value of the regulated DC output voltage. The switchable leakage protection circuit may for example select the second switch state when the absolute value of the DC input voltage falls a certain amount below the absolute value of the regulated DC output voltage for example 0.7 Volt.

The first semiconductor switch arrangement may comprise a DMOS transistor switch coupled between the bulk terminal and the source terminal of the DMOS pass transistor. The bulk terminal of the DMOS switch transistor is preferably electrically connected to the drain terminal of the DMOS switch transistor as discussed in further detail below with reference to FIG. 4.

The second semiconductor switch arrangement may comprise a plurality of cascaded low-voltage MOS transistors connected between the bulk terminal of the DMOS pass transistor and the regulator output. The second semiconductor switch arrangement may additionally comprise a resistor string comprising a plurality of cascaded resistors connected between the regulator input and a ground potential or a negative supply rail of the DC linear voltage regulator circuit. The resistor string comprises a plurality of interposed voltage tapping nodes connected to respective gate terminals of the plurality of cascaded low-voltage MOS transistors as discussed in further detail below with reference to FIG. 5.

The third semiconductor switch arrangement may comprises a low-voltage PMOS transistor which comprises a drain terminal connected to the gate terminal of the DMOS pass transistor, a source terminal connected to an intermediate coupling node between a pair of low-voltage MOS transistors of the plurality of cascaded low-voltage MOS transistors. The low-voltage PMOS transistor additionally comprises a gate terminal connected to the regulator input and a bulk terminal connected to the bulk terminal of the DMOS pass transistor. The low-voltage PMOS transistor is conducting/on in the second switch state of the switchable leakage prevention circuit, corresponding to the reverse voltage operating conditions, such that the gate and drain terminals of the DMOS pass transistor are interconnected through a relatively small on-resistance of the low-voltage PMOS transistor. The gate and drain terminals of the DMOS pass transistor are also coupled to the regulator output.

Some embodiments of the DC linear voltage regulator circuit may further comprise a Zener diode connected between the regulator input and the gate terminal of the DMOS pass transistor to protect the latter against excessive gate source voltages, e.g. gate source voltage above a maximum safe operating limit of the DMOS pass transistor. A cathode of the Zener diode may be connected to the regulator input and an anode of the Zener diode connected to the gate terminal of the DMOS pass transistor as discussed in further detail below with reference to FIGS. 6 & 7. Since the third semiconductor switch arrangement electrically connects the gate terminal of DMOS pass transistor and the regulator output in response to the reverse voltage operating conditions this action may apply a forward bias voltage to the Zener diode for example when the DC voltage at the regulator output exceeds the DC input voltage with approximately 0.7 V or more. This operating condition may lead to an undesired flow of leakage or excess current through the Zener diode unless a precautionary measure to block this excess current path is taken. One embodiment of the third semiconductor switch arrangement comprises such a precautionary measure in form of a low-voltage MOS transistor connected in series with the Zener diode between the regulator input and the gate terminal of the DMOS pass transistor to selectively enable and disable current flow through the Zener diode in the first and second switch states, respectively. This advantageous feature is discussed further detail below with reference to FIGS. 6 & 7.

A second aspect of the invention relates to a method of protecting a regulator output of a DC linear voltage regulator circuit from reverse leakage current. The DC linear voltage regulator circuit comprises a DMOS pass transistor coupled between the regulator input and the regulator output and the method of protecting the regulator output of the DC linear voltage regulator circuit comprises steps of:

a) comparing an absolute value of a DC voltage at the regulator output to an absolute value of a DC voltage at the regulator input, b) connecting a bulk terminal of the DMOS pass transistor to the regulator input by automatically selecting a first switch state of a switchable leakage prevention circuit when the absolute value of the DC voltage at the regulator input exceeds the absolute value of the DC voltage at the regulator output, c) connecting the bulk terminal of the DMOS pass transistor to the regulator output by automatically selecting a second switch state of the switchable leakage prevention circuit when the absolute value of the DC voltage at the regulator input is smaller than the absolute value of the DC voltage at the regulator output.

The method may comprise a further step of:

d) connecting a gate terminal of the DMOS pass transistor to the regulator output via the switchable leakage prevention circuit when the absolute value of the DC voltage at the regulator input is smaller than the absolute value of the DC voltage at the regulator output, e) disconnecting the gate terminal of the DMOS pass transistor and the regulator output by the third semiconductor switch arrangement when the absolute value of the DC voltage at the regulator input exceeds the absolute value of the DC voltage at the regulator output.

A third aspect of the invention relates to a semiconductor substrate or die comprising a DC linear voltage regulator circuit according to any of the above-described embodiments integrated thereon. The semiconductor substrate may be fabricated in a suitable DMOS semiconductor process comprising only low-voltage NMOS and PMOS transistors in addition to DMOS transistors.

BRIEF DESCRIPTION OF THE DRAWINGS

Preferred embodiments of the invention will below be described in additional detail in connection with the appended drawings, in which:

FIG. 1 is a schematic circuit diagram of a typical prior art DC linear voltage regulator circuit 100 operating under normal conditions to generate a regulated DC output voltage based on a DC input voltage applied the regulator input $V_{INP}$ for example from an DC voltage supply $V_{sup}$ as schematically illustrated. The regulated DC output voltage is supplied at a regulator output $V_{OUT}$ where an active or passive electrical load is connected during normal operation of the DC linear voltage regulator circuit 100. A DMOS pass transistor M1 functions as a regulating element of the prior art DC linear voltage regulator circuit 100 and comprises source terminal 108 connected to the regulator input $V_{INP}$ and a drain terminal connected to the regulated DC output. A bulk terminal 106 of the DMOS pass transistor M1 is connected to the source terminal 108 which is situated at the highest potential of the voltage regulator circuit 100 under normal operating conditions. A negative power supply rail or terminal 101 of the DC linear voltage regulator circuit 100 is connected to a negative DC rail or a ground potential. The DC voltage supply $V_{sup}$ may generate and apply a DC voltage between 10 V and 50 V at regulator input $V_{INP}$. The DC linear voltage regulator circuit 100 may be configured to supply a regulated DC output voltage of fixed and predetermined value, such as a DC voltage between 3 V and 10 V, substantially independent of the actual DC voltage at the regulator input $V_{INP}$. Hence, suppressing slow DC voltage variations of the DC voltage supply $V_{sup}$ and noise and ripple voltage components on the DC voltage supply $V_{sup}$.

FIG. 2 is a schematic circuit diagram of the typical prior art DC linear voltage regulator circuit 100 discussed above subjected to reverse voltage operating conditions by external DC voltage source 120. The reverse voltage operating conditions of the DC linear voltage regulator circuit 100 are achieved because the DC voltage supply $V_{sup}$ is turned off such that the DC input voltage applied the regulator input $V_{INP}$ is about zero as schematically illustrated by the ground potential coupled to the regulator input $VI_{NP}$. At the same time an external DC voltage source 120 which is coupled to the regulator output $V_{OUT}$ remains active. These reverse voltage operating conditions may be achieved in practical applications where the regulator output $V_{OUT}$ of the regulator circuit 100 is connected in parallel to another voltage supply apparatus comprising the external DC voltage source 120. In such a parallel coupling arrangement may be desirable to be able to turn-off or remove the power or voltage supply to the regulator circuit 100 and instead let the parallelly arranged voltage supply apparatus override the regulated DC output voltage provided by the regulator circuit under normal operating conditions. However, the application of the DC voltage of the external DC voltage source 120, for example 5 V, induces a large leakage current 122 flow through the bulk terminal 106 of the of the DMOS pass transistor M1 and down to the grounded drain terminal of M1. This undesired flow of leakage current 122 is caused by the fact that a PN diode junction is formed by the drain and bulk diffusions of the DMOS pass transistor M1. This PN diode junction becomes forward biased under the reverse voltage operating conditions of the DC linear voltage regulator circuit 100 because the drain terminal of the DMOS pass transistor M1 is situated at a higher voltage potential than the bulk terminal 106. The large leakage current 122 flowing through the bulk terminal 106 or diffusion of M1 under reverse operation conditions represent a significant waste of power and may damage various active and passive components the DC linear voltage regulator 100 by overheating.

FIG. 3A shows a simplified schematic circuit diagram of a DC linear voltage regulator circuit 300 in accordance with a first embodiment of the invention under normal operating conditions. FIG. 3B shows a simplified schematic circuit diagram of the DC linear voltage regulator circuit 300 operating under reverse voltage operating conditions where an active external DC voltage source 320 is coupled to a regulator output $V_{OUT}$.

Figure 1:
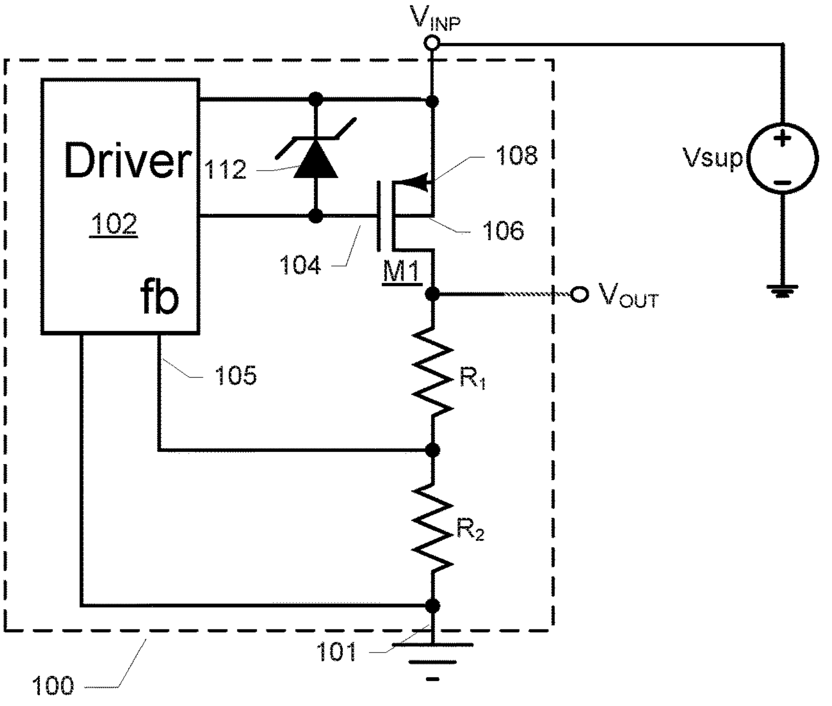
FIG. 1 is a schematic circuit diagram of a typical prior art DC linear voltage regulator circuit.
Figure 2:
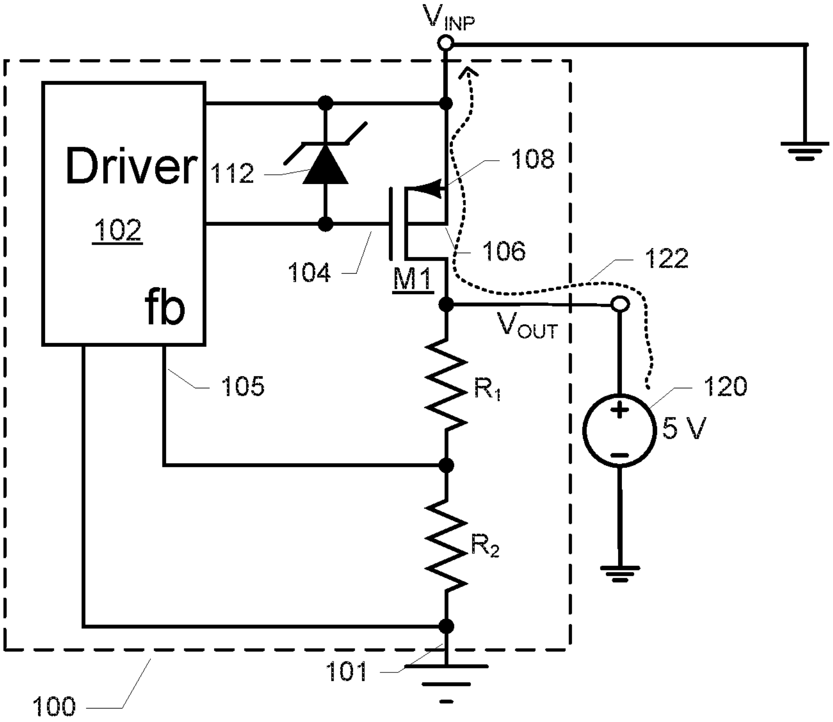
FIG. 2 is a schematic circuit diagram of the typical prior art DC linear voltage regulator circuit subjected to reverse voltage operating conditions.
Figure 3A:
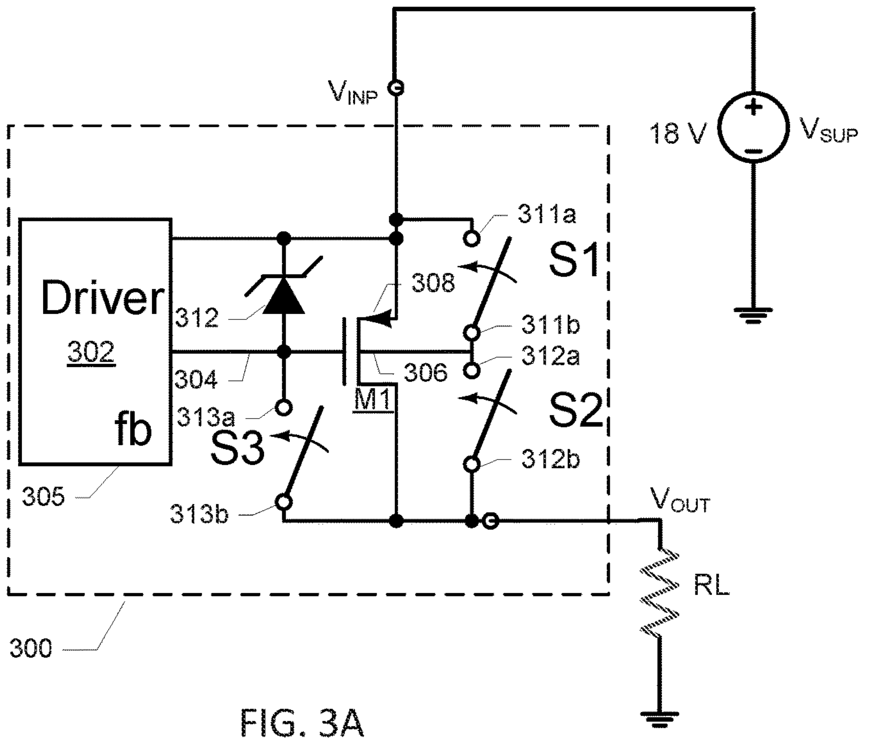
FIG. 3A shows a simplified schematic circuit diagram of a DC linear voltage regulator circuit in accordance with a first embodiment of the invention operating under normal operating conditions.

Under normal operating conditions of the DC linear voltage regulator circuit 300 as illustrated on FIG. 3A, the circuit 300 generates a regulated DC output voltage based on a DC input voltage applied the regulator input $V_{INP}$ for example from a DC voltage supply $V_{sup}$ as schematically illustrated. The regulated DC output voltage is supplied at a regulator output $V_{OUT}$ where an active or passive electrical load, schematically indicated by load resistor RL, is connected during normal operation of the regulator circuit 300. A DMOS pass transistor M1 functions as a regulating element of the voltage regulator circuit 300 and comprises a source terminal 308 connected to the regulator input $V_{INP}$ and a drain terminal connected to the regulator output $V_{OUT}$. A bulk terminal 306 of the DMOS pass transistor M1 is connected to the source terminal 308. The latter is situated at the highest potential of the voltage regulator circuit 300 under the illustrated normal operating conditions. The voltage regulator circuit 300 may comprise a negative power supply rail or terminal (not shown) connected to a negative DC rail or a ground potential. The voltage regulator circuit 300 may be adapted to various DC input and DC output voltage characteristics depending on any particular application. The DC input and DC output voltage may both be negative DC voltages relative to a ground potential in some embodiments of the invention. The voltage regulator circuit 300 may be configured to operate with DC voltages at the regulator input $V_{INP}$ between 10 V and 50 V. The DC linear voltage regulator circuit 100 may be configured to supply a regulated DC output voltage at the regulator output $V_{OUT}$ of fixed and predetermined value, such as a DC voltage between 3 V and 10 V. The voltage regulating property of the voltage regulator circuit 300 ensures the regulated DC output voltage remains substantially independent of the actual DC input voltage at the regulator input $V_{INP}$ within a nominal DC input voltage range of the circuit. Hence, the voltage regulator circuit 300 serves to suppressing at regulated DC output voltage slow DC voltage variations of the DC voltage supply $V_{sup}$ and noise and ripple voltage components on the DC voltage supply $V_{sup}$ at the regulator input $V_{INP}$.

The voltage regulator circuit 300 additionally comprises an error amplifier (not shown) and a DC reference voltage generator (not shown) residing within a control circuit block (driver) 302. The error amplifier may comprise a first input and a second input and an output supplying an output voltage that is responsive to a voltage or current difference between the first and second inputs. The first input of the error amplifier is coupled to an output of the DC reference voltage generator such that a fixed or programmable DC reference voltage is applied to the first input of the error amplifier. The second input of the error amplifier is coupled to the regulated DC output voltage of the regulator circuit 300 via a feedback voltage regulation loop. The second input of the error amplifier may for example sense or sample a fraction of the regulated DC output voltage via a suitable resistive or capacitive voltage divider of the voltage regulation loop coupled to the regulated DC output voltage. This fraction of the regulated DC output voltage may for example be conveyed to the second input of the error amplifier via a sense or feedback input 305 of the control circuit block 302. The output voltage of the error amplifier may accordingly function to generate an error voltage representing the instantaneous voltage or current difference between the regulated DC output voltage and the fixed or programmable DC reference voltage applied to the first and second inputs, respectively, of the error amplifier. This error voltage is applied or coupled to a gate terminal of the DMOS pass transistor M1 via signal line or wire 304 forcing M1 to increase or decrease the supply of regulation current and voltage to the active or passive electrical load RL in accordance with the polarity and magnitude of the error voltage. The DC reference voltage generator may for example be based on a bandgap voltage reference circuit (not shown). The skilled person will understand that the error amplifier, the voltage regulation loop and the voltage sampling or sensing circuit may operate on signals in the analog domain or digital domain or a mixture of signals from both domains. The voltage regulation loop may for example comprise an ND converter for sensing the regulated DC output voltage, a D/A converter, a digital controller disposed between the ND converter and D/A converter for controlling the error amplifier etc.

Figure 3B:
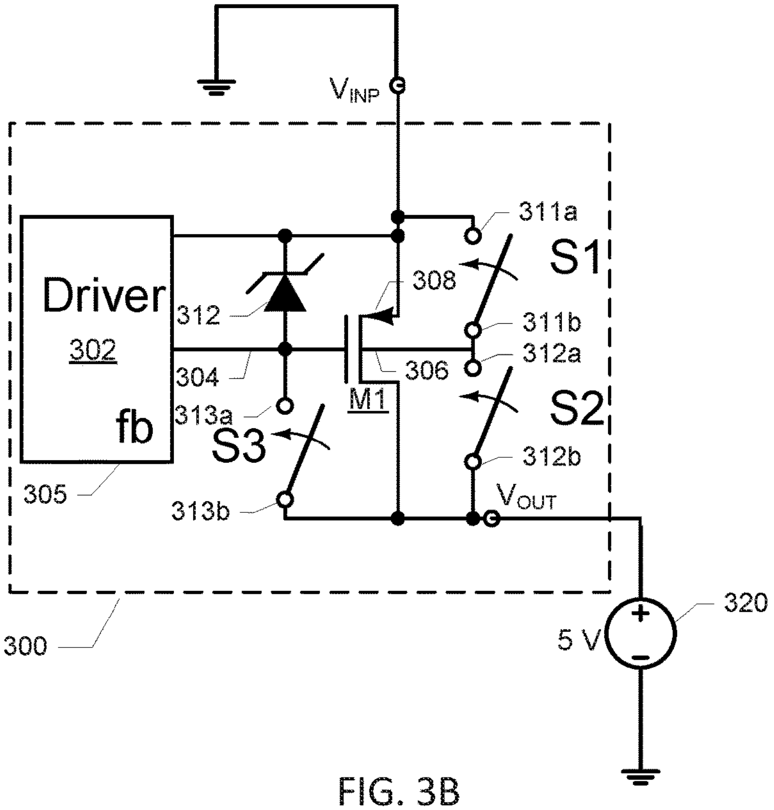
FIG. 3B shows a simplified schematic circuit diagram of the DC linear voltage regulator circuit operating in accordance with the first embodiment under reverse voltage operating conditions.

The voltage regulator circuit 300 additionally comprises a switchable leakage prevention circuit, preferably comprising three individual semiconductor switch arrangements S1, S2 and S3, configured to automatically detect and interrupt or suppress the undesired flow of leakage current from the regulator output $V_{OUT}$ to the bulk terminal or diffusion 306 of the DMOS pass transistor M1 as discussed above in connection with the shortcomings of the prior art DMOS based voltage regulator circuit 100. The switchable leakage prevention circuit in accordance with the present invention may be configured to automatically switch the switchable leakage prevention circuit between first and second switch states depending on the relative values of the DC input voltage and the regulated DC output voltage. The switchable leakage prevention circuit may be configured to automatically electrically connect or couple the bulk terminal 306 of the DMOS pass transistor M1 to the regulator input $V_{INP}$ (and to the source terminal 308 of M1) in the first switch state of a switchable leakage prevention in response to the absolute value of the DC input voltage exceeds the absolute value of the DC output voltage at the regulator output. This DC input and DC output voltage range corresponds to normal operating conditions of the voltage regulator circuit 300 where the voltage regulator circuit 300 provides its intended regulation of the DC input voltage as discussed above. The DMOS pass transistor M1 operates in its active region under these normal operating conditions of the voltage regulator circuit 300. On the other hand, if the switchable leakage prevention circuit detects that the absolute value of the DC input voltage falls below or is smaller than the absolute value of the DC output voltage, the switchable leakage prevention circuit may be configured to automatically electrically connect or couple the bulk terminal 306 of the DMOS pass transistor M1 to the regulator output $V_{OUT}$ (and to the drain terminal of M1) by selecting the second switch state of the switchable leakage prevention. This DC input and DC output voltage range corresponds to the above-discussed reverse voltage operating conditions of the voltage regulator circuit 300 where the voltage regulator circuit 300 is unable to function as intended and preventive measures against the flow of bulk leakage current through the DMOS pass transistor M1 are advantageous. The presence of the reverse voltage operating conditions is illustrated on FIG. 3B where the active external DC voltage source 320 is coupled to the regulator output $V_{OUT}$ while the regulator input $V_{INP}$ is left unpowered, e.g. placed at zero volt/ground potential. The regulator input $V_{INP}$ may be left unpowered for various reasons for example due to an unpowered state or failure of the external DC voltage supply $V_{SUP}$.

As briefly mentioned above, the switchable leakage prevention circuit preferably comprises three individual semiconductor switch arrangements S1, S2 and S3 operating between conducting/on states and non-conducting/off states in accordance with their respective switch control signals as defined by the first and second switch states of the switchable leakage prevention circuit. Each of the three individual semiconductor switch arrangements S1, S2 and S3 may comprise one or more low-voltage PMOS and/or NMOS transistor(s) operating as switch elements as discussed in further detail below. The switchable leakage prevention circuit, for example comprising the three individual semiconductor switch arrangements S1, S2 and S3, is preferably configured to perform the automatic detection and interruption of the leakage current flow without using digital logic circuitry or a digital controller/processor for monitoring and evaluating e.g. the voltages at regulator input $V_{INP}$ and the regulator output $V_{OUT}$. This feature provides good reliability and facilitates a compact circuit layout using a small number of components and minimal semiconductor die area.

The first and second semiconductor switch arrangements S1 and S2, respectively, are configured to connect the bulk terminal or diffusion 306 of M1 to the regulator input $V_{INP}$, and therefore also the source terminal 308 of M1, in the first switch state of the switchable leakage prevention circuit corresponding to normal operating conditions of the voltage regulator circuit 300 as schematically illustrated on FIG. 3A). The first and second semiconductor switch arrangements S1 and S2, respectively, are configured to alternatively connect the bulk terminal or diffusion 306 of M1 to the regulator output $V_{OUT}$, and therefore also the drain terminal of M1, under the reverse voltage operating conditions of the voltage regulator circuit 300 as schematically illustrated on FIG. 3B. The skilled person will appreciate that the first and second switch states of the switchable leakage prevention circuit may be achieved by selecting the conducting/on state of S1 and the non-conducting/off state of S2 under the normal operating conditions of the voltage regulator circuit 300 and vice versa under the reverse voltage operating conditions. The first and second switch terminals 311*a*, 311*b* of S1 are electrically connected via a relatively small on-resistance of S1 in the conducting/on state of S1 and disconnected via a very large off-resistance in the non-conducting/off state of S1. Likewise, the first and second switch terminals 312*a*, 312*b* of S2 are electrically connected via a relatively small on-resistance of S2 in the conducting/on state of S2 and disconnected via a very large off-resistance of S2 in the non-conducting/off state of S2. The third semiconductor switch arrangement S3 of the switchable leakage prevention circuit is configured to connect the regulator output $V_{OUT}$ to the gate terminal 304 of M1 in the second switch state and disconnect the regulator output $V_{OUT}$ and the gate terminal 304 in the first switch state of the switchable leakage prevention circuit state by disconnecting the electrical connection between first and second switch terminals 313*a*, 313*b* of S3.

The skilled person will understand that the voltage regulator circuit 300 including the above-discussed switchable leakage prevention circuit preferably is integrated on a single MOS semiconductor substrate or die manufactured in a DMOS compatible process. In a particularly attractive embodiment of the voltage regulator circuit 300 only low voltage symmetric PMOS and NMOS transistors are used to implement the first, second and third semiconductor switch arrangements S1, S2 and S3 of the switchable leakage prevention circuit as described in further detail below with reference to FIGS. 4, 5, 6 and 7. This feature is advantageous because the present switchable leakage prevention circuit can be integrated in DMOS based voltage regulator circuits, and provide adequate protection against the above-mentioned reverse leakage currents under reverse operating conditions, despite being fabricated in one of the numerous DMOS processes where high voltage symmetric PMOS and NMOS transistors are unavailable.

Figure 4:
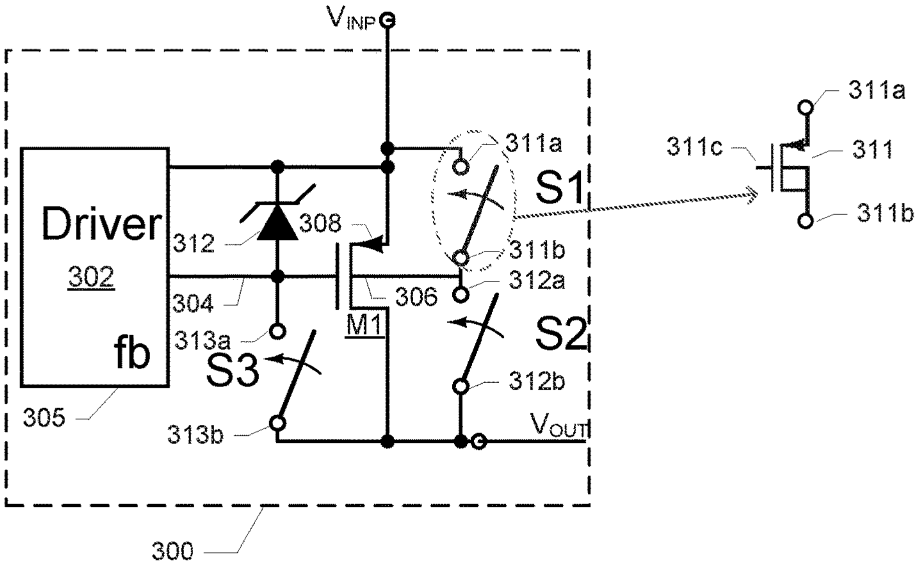
FIG. 4 shows a simplified schematic circuit diagram of the DC linear voltage regulator circuit in accordance with the first embodiment of the invention further illustrating implementation details of a first semiconductor switch arrangement connected to a bulk terminal of DMOS pass transistor.

FIG. 4 shows a simplified schematic circuit diagram of the voltage regulator circuit 300 illustrating implementation details of an exemplary embodiment of the first semiconductor switch arrangement S1. The first semiconductor switch arrangement S1 comprises a single DMOS transistor switch 311 with its source and drain terminals 311*a*, 311*b* connected between the bulk terminal 306 and the source terminal 308 of the DMOS pass transistor M1. The bulk diffusion or terminal and the drain terminal 311*b* of the DMOS transistor switch 311 are permanently electrically connected. In the first switch state of the switchable leakage prevention circuit, the DMOS transistor switch 311 is on/conducting because its gate terminal 311*c* is connected to an intermediate coupling node G of the S2 switch arrangement (refer to FIG. 5) discussed in additional detail below. The intermediate coupling node G is at a lower potential than the source terminal 311*a* which is connected to the active DC voltage supply $V_{sup}$ via the regulator input $V_{INP}$ such that first and second switch terminals 311*a*, 311*b* of S1 are electrically connected via the above-mentioned small on-resistance of S1. On the other hand, in the second switch state of the switchable leakage prevention circuit, i.e. during the reverse voltage operating conditions of the voltage regulator circuit 300, the DMOS transistor switch 311 is off/non-conducting, because its source terminal 311*a* is at zero volts and the gate terminal 311*c* has approximately the potential as the regulated output $V_{OUT}$. Furthermore, since the bulk terminal and the drain terminal 311*b* of S1 are jointly connected to the regulated output $V_{OUT}$ via S2, the bulk terminal of S1 is also reverse biased or blocking in the non-conducting state of S1.

Figure 5:
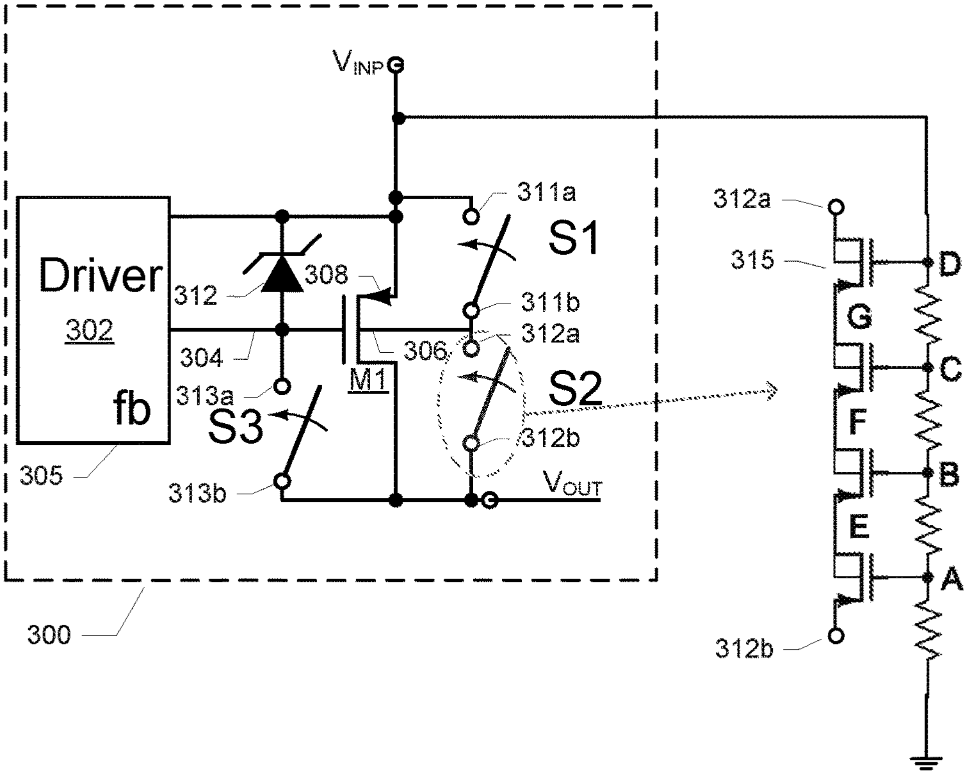
FIG. 5 shows a simplified schematic circuit diagram of the DC linear voltage regulator circuit in accordance with the first embodiment of the invention further illustrating implementation details of a second semiconductor switch arrangement connected to the bulk terminal of DMOS pass transistor.

FIG. 5 shows a simplified schematic circuit diagram of the voltage regulator circuit 300 illustrating implementation details of an exemplary embodiment of the second semiconductor switch arrangement S2. The second semiconductor switch arrangement S2 comprises four individual and cascaded low-voltage PMOS transistors connected between the bulk terminal 306 of the DMOS pass transistor M1 and the regulator output $V_{OUT}$. The skilled person will appreciate that fewer or additional cascaded low-voltage PMOS transistors may be used in alternative embodiments of invention for example depending on the maximum required DC input voltage and the break-down voltage of low voltage PMOS transistors is any particular CMOS semiconductor process. The second semiconductor switch arrangement S2 further comprises a resistor string comprising four cascaded resistors connected between the the regulator input $V_{INP}$ and the ground potential or negative supply rail of the DC linear voltage regulator circuit 300. The number of cascaded resistances may correspond to the number of cascaded low voltage PMOS transistors. The skilled person will appreciate that a corresponding capacitor string of cascaded capacitors may be used in the alternative. As illustrated, the resistor string comprises a plurality of interposed voltage tapping nodes D, C, B, A connected to respective gate terminals of the four cascaded low-voltage MOS transistors. The outer coupling nodes of S2 are 312*a*, 312*b* corresponding to the input and output terminals of S2 itself while intermediate coupling nodes between the four cascaded low voltage PMOS transistors have been assigned node reference symbols G, F, E.

To illustrate the operation of second semiconductor switch arrangement S2, a specific example is illustrated below with reference to Table 1 where the voltage regulator circuit 300 has been configured to provide a regulated output voltage of 5 V at the regulator output $V_{OUT}$. The DC input voltage at the regulator input $V_{INP}$ is 16 V in this example under the normal operating conditions of the circuit 300.

Table 1 shows the node or terminal DC voltages in the voltage regulator circuit 300 under normal operating conditions and reverse voltage operating conditions in column 3 and 2, respectively. In this example, the resistance of the resistors of the resistor string are assumed to be substantially identical. Under normal operating conditions, where the first switch state of the switchable leakage prevention circuit is selected, S2 is non-conducting/off while S1 is conducting/on such that the bulk terminal of M1 is pulled to the approximately 16 V at the regulator input $V_{INP}$. This means that the outer coupling node 312*a* of switch S2 is pulled to 16 V and that the gate terminal of the uppermost low voltage PMOS transistor 315 is likewise at 16 V. However, the tapping node C of the resistor string is at 12 V at indicated in Table 1 due to the voltage division action of the resistor string such that the uppermost low voltage PMOS transistor 315 has a gate-source voltage of about 0 V placing the uppermost low voltage PMOS transistor 315 in its off state. The residual three cascaded low-voltage PMOS transistors are likewise in their respective off states as apparent from the DC node voltage indicated in Table 1. In this manner, the entire S2 arrangement is off or non-conducting between the input and output terminals 312*a*, 312*b* under the normal operating conditions of the circuit 300 allowing the previously discussed S1 to pull the bulk terminal of M1 to approximately 16 V. Furthermore, the scaling of the resistor string and cascading of the low-voltage PMOS transistors ensure that the drain to source voltage across each of the four low-voltage PMOS transistors does not exceed the upper safe voltage limit of about 5 V for these low-voltage transistor types during normal operation of the circuit 300.

Under reverse voltage operating conditions, where the second switch state of the switchable leakage prevention circuit is selected, S2 is conducting or on while S1 is non-conducting such that the bulk terminal of M1 is pulled to the approximately 5 V at the drain terminal of M1 and regulator output $V_{OUT}$. The DC voltage at each of the tapping nodes D, C, B, A of the resistor string is zero because the DC input voltage at the regulator input $V_{INP}$ is 0 V or ground potential. Since, the source terminal of the lower most low voltage PMOS transistor is pulled to 5 V at the regulator output $V_{OUT}$ by the external DC voltage source, the lower most low voltage PMOS transistor is conducting. The conducting state of the lower most low voltage PMOS transistor pulls the intermediate coupling node E to 5 V which in turn puts the next most low voltage PMOS transistor in its conducting state by the negative gate-source voltage. The process is repeated in respect of the two residual low voltage PMOS transistors such that all four cascaded low voltage PMOS transistors are conducing/on. Consequently, the input and output terminals 312*a*, 312*b* of the S2 arrangement are electrically connected by the previously discuss relatively small total on-resistance of the four cascaded low voltage PMOS transistors under the reverse voltage operating conditions of the voltage regulator circuit 300 such that the bulk terminal of M1 is pulled to the approximately 5 V at the regulator output $V_{OUT}$.

TABLE 1

| Node voltage | Reverse voltage state | Normal state |
|---|---|---|
| VA | 0 | 4 |
| VB | 0 | 8 |
| VC | 0 | 12 |
| VD | 0 | 16 |
| VE | 5 | 5 |
| VF | 5 | 8 |
| VG | 5 | 12 |
| Vout | 5 | 5 |
| Vbulk | 5 | 16 |

Figure 6:
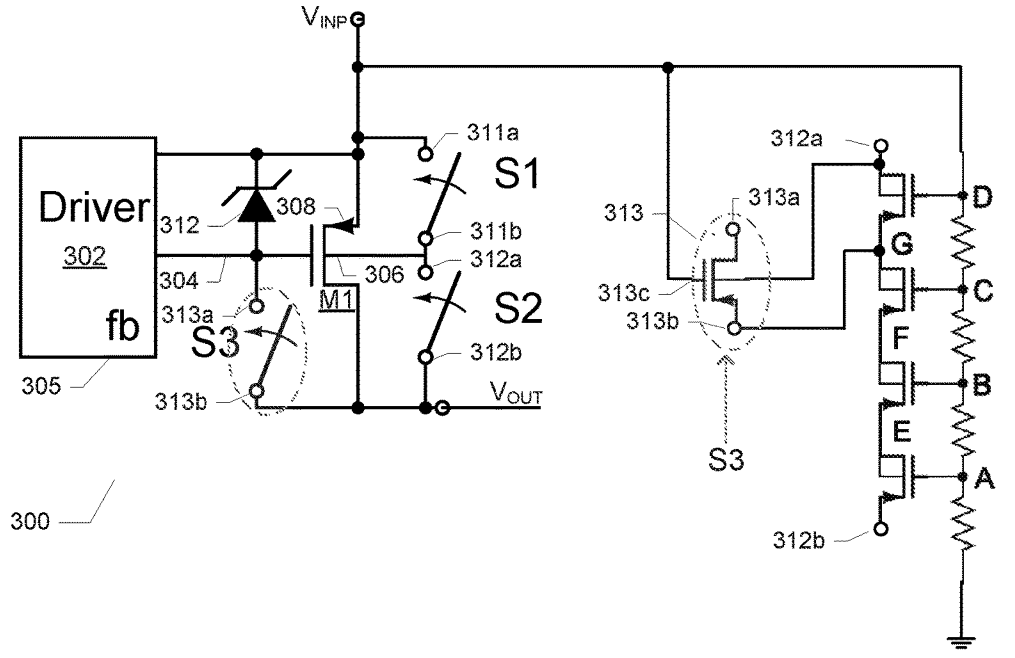
FIG. 6 shows a simplified schematic circuit diagram of the DC linear voltage regulator circuit in accordance with the first embodiment of the invention further illustrating implementation details of a third semiconductor switch arrangement connected to a gate terminal of DMOS pass transistor.

FIG. 6 shows a simplified schematic circuit diagram of the voltage regulator circuit 300 where certain implementation details of an exemplary implementation of the third semiconductor switch arrangement S3 are illustrated. The S2 switch arrangement is also depicted on the drawing to better illustrate the interaction between the S3 switch arrangement and certain components of the S2 switch arrangement. The S3 switch arrangement comprises a low-voltage PMOS transistor 313 connected between the drain terminal and gate terminal (line 304) of the DMOS pass transistor M1. The two switch terminals 313*a*, 313*b* of the S3 switch arrangement accordingly corresponds to the source and drain terminals of the low-voltage PMOS transistor 313. The S3 switch arrangement comprises an additional semiconductor switch (not shown on FIG. 6) placed in series with the Zener diode 312 as discussed in further detail below with reference to FIG. 7. A bulk terminal of the low-voltage PMOS transistor 313 is connected to the outermost node 312*a* of the S2 switch arrangement while a source terminal of the low-voltage PMOS transistor 313 is connected to the intermediate coupling node G of the S2 switch arrangement.

In the first switch state of the switchable leakage prevention circuit, the low-voltage PMOS transistor 313 of S3 is off and the S2 switch arrangement is likewise off for the reasons discussed in detail above. The low-voltage PMOS transistor 313 of S3 is non-conducting because the gate terminal 313*c* is pulled to approximately 16 V at the regulator input $V_{INP}$ while the source terminal 313*b* is electrically connected to the intermediate coupling node G, which has a DC voltage of approximately 12 V for the reasons discussed above and also indicated in Table 2. These conditions provide a positive gate-source voltage of about 4 V to cut-off the low-voltage PMOS transistor 313. Finally, the bulk terminal of the low-voltage PMOS transistor 313 is connected to a higher potential than the source terminal 313*b* making the source-bulk junction reverse biased to prevent any flow of bulk leakage current through the low-voltage PMOS transistor 313.

In the second switch state of the switchable leakage prevention circuit, corresponding to the reverse voltage operating conditions, the low-voltage PMOS transistor 313 of S3 is conducting and the S2 switch arrangement is likewise conducting for the reasons discussed in detail above. The low-voltage PMOS transistor 313 is conducting because the gate terminal 313*c* is pulled to the approximately 0 V or ground at the regulator input $V_{INP}$ while the source terminal 313*b* is electrically connected to the intermediate coupling node G, which is pulled to a DC voltage of approximately 5 V at the regulator output $V_{OUT}$ for the reasons discussed above, and also indicated in Table 1, leaving the gate-source voltage negative with about 5 V. Finally, the bulk terminal of the low-voltage PMOS transistor 313 is also connected to the 5 V DC at regulated output $V_{OUT}$ such that the source-bulk junction of the low-voltage PMOS transistor 313 is biased at around 0 V. This renders the source-bulk junction non-conducting and thereby eliminates any flow of bulk leakage current through the PMOS transistor 313 under the reverse voltage operating conditions.

Since the low-voltage PMOS transistor 313 of S3 is conducting under reverse voltage operating conditions of the voltage regulator circuit 300, this may lead to a forward bias condition of the Zener diode 312 with an accompanying and undesired flow of leakage current through the Zener diode 312 in embodiments of the voltage regulator circuit 300 including such a Zener diode 312 a protective measure for M1. However, this undesired flow of leakage current through the Zener diode 312 may be eliminated or suppressed by adding preventive components or measures in the S3 switch arrangement as illustrated on FIG. 7.

Figure 7:
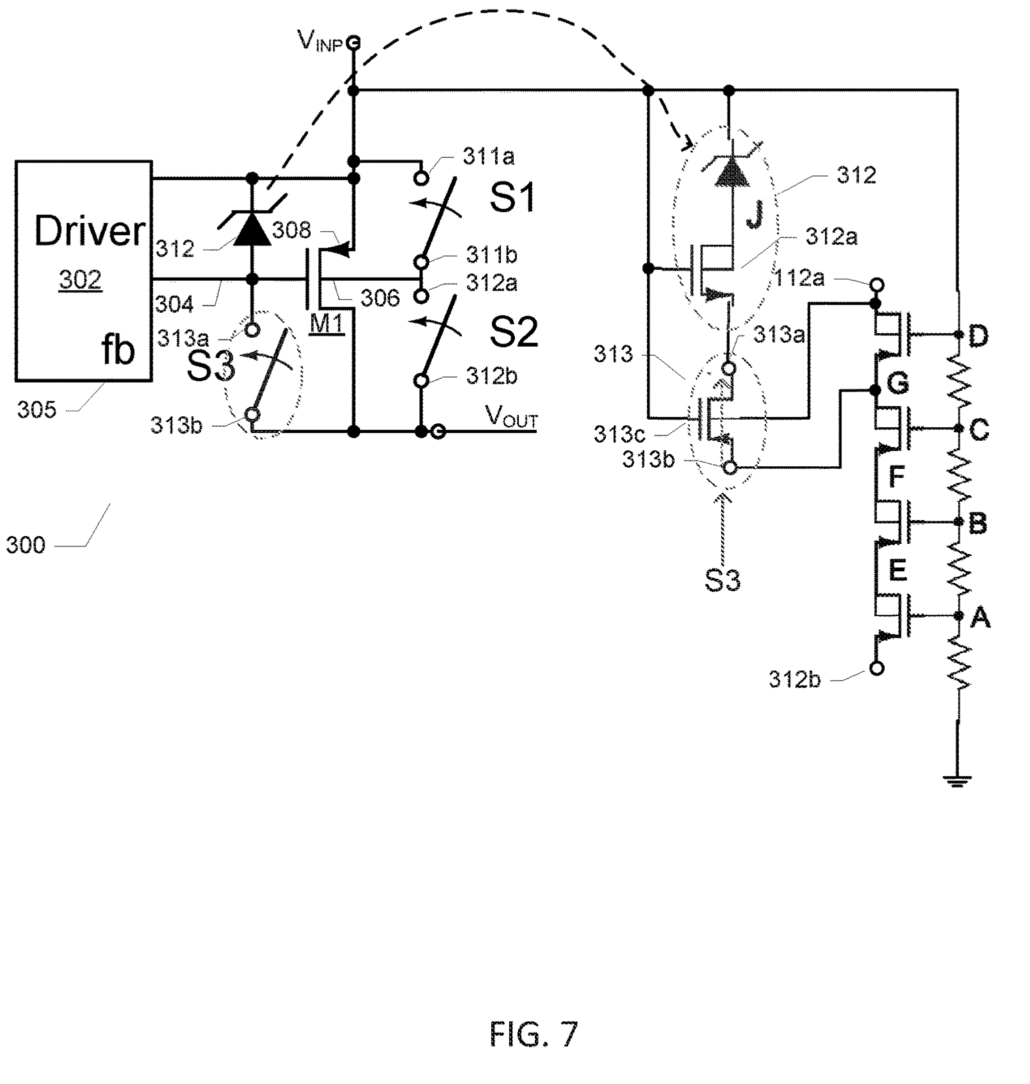
FIG. 7 shows a simplified schematic circuit diagram of the DC linear voltage regulator circuit in accordance with a second embodiment of the invention illustrating implementation details of an alternative third semiconductor switch arrangement connected to a gate terminal of DMOS pass transistor.

FIG. 7 shows a simplified schematic circuit diagram of the DC linear voltage regulator circuit 700 in accordance with a second embodiment of the invention illustrating implementation details of a third semiconductor switch arrangement S3 in accordance with an alternative embodiment thereof. The same features of the above-described first embodiment of the voltage regulator circuit 300 and the present embodiment of the regulator circuit 700 have been provided with corresponding reference numerals to ease comparison. The S3 switch arrangement comprises an additional low-voltage NMOS transistor 312*a* coupled in series with the Zener diode 312 compared to the S3 switch arrangement discussed above.

Table 2 below shows exemplary DC voltages of nodes and terminals of the voltage regulator circuit 700 under normal operating conditions and reverse voltage operating conditions in column 3 and 2, respectively. The low-voltage PMOS transistor 313 of S3 is operating as discussed above both under normal operating conditions mode and the reverse voltage operating mode of the voltage regulator circuit 700. However, under the reverse voltage operating conditions or mode where the low-voltage PMOS transistor 313 is conducting, the low-voltage NMOS transistor 312*a* is in a non-conducting state or off because its gate terminal is coupled to 0 V at the regulator input $V_{INP}$ while the source terminal is coupled to the approximately 5 V at the regulator output $V_{OUT}$. Consequently, the low-voltage NMOS transistor 312*a* is off or non-conduction and therefore blocking the undesired flow of leakage current through the Zener diode 312 under the reverse voltage operating conditions of the voltage regulator circuit 700. The intermediate node J disposed between the drain terminal of the low-voltage NMOS transistor 312*a* and Zener diode 312 has a potential of approximately 0 V because of zero current through the Zener diode 312. The intermediate node H disposed between the source terminal of the low-voltage NMOS transistor 312*a* and the switch terminal 313*a* of S3 is connected to the signal wire 304 connected to the gate terminal of M1.

Under normal operating conditions of the voltage regulator circuit 700, where the first switch state of the switchable leakage prevention circuit is selected, the low-voltage PMOS transistor 313 is off or non-conducting while the low-voltage NMOS transistor 312*a* is switched to a conducting state because the gate terminal of the NMOS transistor 312*a* is coupled to 16 V at the regulator input $V_{INP}$ while the source terminal is coupled to the approximately gate terminal of M1 which typically has a voltage situated 0-5 V below the DC input voltage. Consequently, the low-voltage NMOS transistor 312*a* is conducting and representing a relatively small series resistance, for example between 100Ω and 10Ω, in series with the Zener diode 312 such that the Zener diode 312 is able to function normally and protect M1 against excessive gate source voltages by limiting the latter voltage in accordance with Zener voltage characteristics of a selected Zener diode. Add node H to FIG. 7 at gate terminal of M1.

TABLE 2

| Node voltage | Reverse voltage operation | Normal operation |
|---|---|---|
| VD | 0 | 16 |
| VBulk | 5 | 16 |
| VG | 5 | 12 |
| VH | 5 | X |
| VJ | 0 | VH |

The invention claimed is:

1. A DC voltage regulator circuit, comprising:

a DMOS transistor provided in a circuit path between a supply voltage and an output terminal of the voltage regulator circuit, the DMOS transistor having gate, source, drain and bulk terminals, a current leakage protection circuit, comprising a first switch coupled between the source and bulk terminals of the DMOS transistor and a second switch coupled between the bulk and drain terminals of the DMOS transistor.

2. The circuit of claim 1, wherein the switches receive respective control signals that cause the first switch to become conductive and the second switch to become non-conductive in an ordinary operating condition of the regulator circuit and the first switch to become non-conductive and the second switch to become conductive in a reverse voltage operating condition.

3. The circuit of claim 1, wherein the first switch comprises a DMOS transistor.

4. The circuit of claim 1, wherein the second switch comprises a source-to-drain connected chain of PMOS transistors.

5. The circuit of claim 1, wherein the second switch comprises a MOS transistor having a voltage rating lower than a rating of the DMOS transistor and a resistor string.

6. The circuit of claim 1, wherein the second switch comprises a MOS transistor having a voltage rating lower than a rating of the DMOS transistor and a plurality of capacitors.

7. The circuit of claim 1, further comprising a third switch coupled between the drain and gate terminals of the DMOS transistor.

8. The circuit of claim 7, wherein the third switch is a MOS transistor having a voltage rating lower than a rating of the DMOS transistor, and the circuit further comprises a Zener diode coupled between the source and gate terminals of the DMOS transistor.

9. The circuit of claim 1, further comprising a driver circuit comprising an error amplifier having a first input for a reference voltage and a second input for a test voltage derived from a voltage at the output terminal.

10. A method of protecting a DC voltage regulator circuit, comprising:

during an ordinary operating condition of the regulator circuit, rendering conductive a first current path between a source terminal and a bulk terminal of a DMOS transistor located in a circuit path between a supply voltage and an output terminal of the regulator circuit, and rendering non-conductive a second current path between the bulk terminal and a drain terminal of the DMOS transistor; and during a reverse voltage operating condition of the regulator circuit:

rendering non-conductive the first current path, and rendering conductive the second current path.

11. The method of claim 10, wherein:

the ordinary operating condition occurs when a magnitude of the supply voltage exceeds a magnitude of a voltage at the output terminal of the regulator circuit, the reverse voltage operating condition occurs when the magnitude of the supply voltage is less than the magnitude of the voltage at the output terminal of the regulator circuit.

12. The method of claim 10, further comprising:

during the ordinary operating condition of the regulator circuit, rendering non-conductive a third current path between the drain terminal and a gate terminal of the DMOS transistor; and during the reverse voltage operating condition, rendering conductive the third current path.

13. The method of claim 10, further comprising driving a control signal to a gate of the DMOS transistor formed from a comparison between a voltage at the output terminal of the regulator circuit and a reference voltage.

14. The method of claim 10, wherein the first and second current paths are rendered conductive and non-conductive by driving control signals to switches within the respective current paths, the control signals causing switches in the first current path to become conductive when the control signals cause switches in the second current path to become non-conductive and the control signals further causing switches in the first current path to become non-conductive when the control signals cause switches in the second current path to become conductive.

15. The method of claim 10, further comprising:

sensing the reverse voltage operating condition from measurement of a voltage difference between the supply voltage and the output terminal, and responsive to the sensing, driving a plurality of cascade connected MOS transistors in the second current path to become conductive.

16. The method of claim 15, wherein the sensing occurs by a resistor string coupled between the supply voltage and the output terminal.

17. The method of claim 15, wherein the sensing occurs by a capacitor string coupled between the supply voltage and the output terminal.

18. The method of claim 10, further comprising:

sensing the ordinary operating condition from measurement of a voltage difference between the supply voltage and the output terminal, and responsive to the sensing, driving a DMOS transistor in the first current path to become conductive.

* * * * *